United States Patent
Chen et al.

(10) Patent No.: US 8,873,295 B2
(45) Date of Patent: Oct. 28, 2014

(54) MEMORY AND OPERATION METHOD THEREOF

(71) Applicant: United Microelectronics Corporation, Hsinchu (TW)

(72) Inventors: Shi-Wen Chen, Kaohsiung (TW); Chi-Chang Shuai, Hsinchu (TW); Chung-Cheng Tsai, Taichung (TW); Ya-Nan Mou, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 231 days.

(21) Appl. No.: 13/685,719

(22) Filed: Nov. 27, 2012

(65) Prior Publication Data

US 2014/0146610 A1 May 29, 2014

(51) Int. Cl.
*G11C 11/34* (2006.01)
*G11C 16/30* (2006.01)

(52) U.S. Cl.
CPC .................................... *G11C 16/30* (2013.01)
USPC .............. 365/185.18; 365/226; 365/230.06

(58) Field of Classification Search
USPC ................................ 365/185.18, 226, 230.06
See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,409,608 A | 10/1983 | Yoder | |
| 4,816,784 A | 3/1989 | Rabjohn | |
| 5,159,205 A | 10/1992 | Gorecki | |
| 5,208,725 A | 5/1993 | Akcasu | |
| 5,212,653 A | 5/1993 | Tanaka | |
| 5,406,447 A | 4/1995 | Miyazaki | |
| 5,446,309 A | 8/1995 | Adachi | |
| 5,583,359 A | 12/1996 | Ng | |
| 5,637,900 A | 6/1997 | Ker | |
| 5,760,456 A | 6/1998 | Grzegorek | |
| 5,808,330 A | 9/1998 | Rostoker | |
| 5,923,225 A | 7/1999 | De Los Santos | |
| 5,959,820 A | 9/1999 | Ker | |
| 6,008,102 A | 12/1999 | Alford | |
| 6,081,146 A | 6/2000 | Shiochi | |
| 6,172,378 B1 | 1/2001 | Hull | |
| 6,194,739 B1 | 2/2001 | Ivanov | |
| 6,246,271 B1 | 6/2001 | Takada | |
| 6,285,578 B1 | 9/2001 | Huang | |
| 6,291,872 B1 | 9/2001 | Wang | |

(Continued)

OTHER PUBLICATIONS

U.S. Appl. No. 13/652,422, filed Oct. 15, 2012.

*Primary Examiner* — Son Dinh
*Assistant Examiner* — Nam Nguyen
(74) *Attorney, Agent, or Firm* — Din Yu Tan

(57) ABSTRACT

An operation method of a memory includes the following steps: determining the number of memory units required to update the content stored therein when the memory is performing a program operation based on the N-bit input data and accordingly generate a first determination result; and providing (N−M) number of loads to a source line decoder of the memory if the first determination result indicates that there are M number of memory units required to update the content stored therein, and thereby coupling the (N−M) number of the provided loads to a transmission path of a power supply voltage in parallel, wherein N and M are natural numbers. A memory is also provided.

20 Claims, 7 Drawing Sheets

(56) References Cited

U.S. PATENT DOCUMENTS

| | | |
|---|---|---|
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon |
| 6,521,939 B1 | 2/2003 | Yeo |
| 6,545,547 B2 | 4/2003 | Fridi |
| 6,560,306 B1 | 5/2003 | Duffy |
| 6,574,159 B2 * | 6/2003 | Ohbayashi et al. ........... 365/201 |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,405,642 B1 | 7/2008 | Hsu |
| 7,672,100 B2 | 3/2010 | Van Camp |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0279484 A1 | 11/2010 | Wang |

\* cited by examiner

MEMORY AND OPERATION METHOD THEREOF

FIELD OF THE INVENTION

The present invention relates to a data storage technique field, and more particularly to a memory and an operation method thereof.

BACKGROUND OF THE INVENTION

Non-volatile memory is a type of memory capable of storing data without the need of external power supply. Thus, the non-volatile memory particularly is suitable for use in portable devices due to the power saving feature.

Basically, the non-volatile memory is categorized to have three operations: read, write and erase operations; wherein the write operation is the so-called program operation. Generally, the voltages required by the non-volatile memory for the performing of the read, write and erase operations are different. In particular, the programming voltage must be very accurate due to the higher demand of the accuracy of the voltage level of the programming voltage while the non-volatile memory is performing the program operation.

SUMMARY OF THE INVENTION

One object of the present invention is to provide a memory capable of stabilizing the programming voltage by dynamically providing various numbers of loads in response to the number of memory units required to be driven.

Another object of the present invention also is to provide an operation method of a memory applicable to be used with the aforementioned memory.

An embodiment of the present invention provides a memory, which includes a decoder, a memory array, a plurality of loads, a load detection circuit and a load control circuit. The decoder includes an input terminal and a plurality of output terminals; and the input terminal is configured to receive a power supply voltage. The memory array includes a plurality of source lines and a plurality of memory units. The source lines each are electrically coupled to the respective output terminal of the decoder and N number of memory units. The loads each are configured to have a load value equal to that of each one of the memory units. The load detection circuit is configured to obtain a N-bit input data of the memory, determine the number of the memory units required to update the content stored therein when the memory is performing a program operation based on the N-bit input data, and generate a first determination result accordingly. The load control circuit is configured to receive the first determination result, specifically, if the first determination result indicates that there are M number of the memory units required to update the content stored therein, the load control circuit provides (N−M) number of the loads to the decoder so as to parallel couple the (N−M) number of provided loads to a transmission path of the power supply voltage, wherein N and M are natural numbers.

Another embodiment of the present invention provides an operation method of a memory. The memory includes a decoder and a memory array. The decoder includes an input terminal and a plurality of output terminals; and the input terminal is configured to receive a power supply voltage. The memory array includes a plurality of source lines and a plurality of memory units. The source lines each are electrically coupled to the respective output terminal of the decoder and N number of memory units. The operation method includes the following steps: obtaining a N-bit input data of the memory, determining the number of memory units required to update the content stored therein when the memory is performing a program operation based on the N-bit input data and accordingly generate a first determination result; and providing (N−M) number of loads to the decoder if the first determination result indicates that there are M number of memory units required to update the content stored therein, and thereby parallel coupling the (N−M) number of the provided loads to a transmission path of the power supply voltage, wherein N and M are natural numbers.

In summary, the memory of the present invention further employs a plurality of loads, a load detection circuit and a load control circuit; wherein the loads each are configured to have a load value equal to that of each one of the memory unit. In addition, the load detection circuit is further configured to obtain N-bit input data of the memory, determine the number of memory units required to update the content stored therein when the memory is performing a program operation based on the N-bit input data and thereby generating a first determination result DS1 accordingly. If the first determination result indicates that there is M number of memory units required to update the content stored therein, the load control circuit provides (N−M) number of loads to the decoder electrically coupled to the source lines and thereby parallel coupling the (N−M) number of provided loads to a transmission path of the power supply voltage. Thus, the programming voltage can, through the aforementioned configuration of the memory of the present invention, be maintained at a stable value due to the loads are dynamically provided in response to the number of the memory unit required to be driven.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
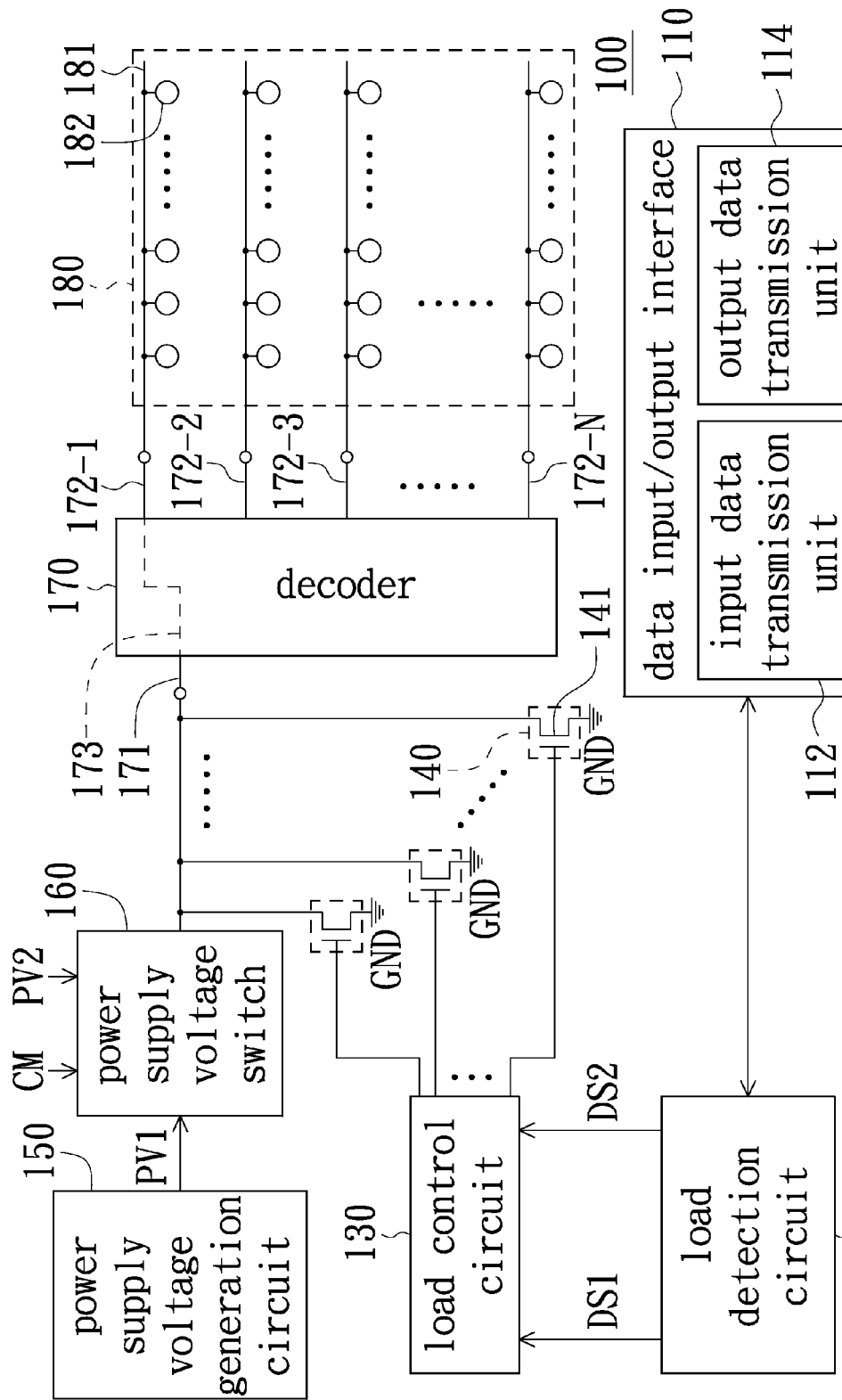
FIG. 1 is a schematic view of a memory in accordance with a first embodiment of the present invention.

FIG. 1 is a schematic view of a memory in accordance with a first embodiment of the present invention; wherein it is to be noted that only the portion of circuit structure associated with the present invention is depicted in FIG. 1, and the memory herein is exemplified by a flash memory. As shown, a memory 100 in this embodiment includes a data input/output interface 110, a load detection circuit 120, a load control circuit 130, a plurality of loads 140, a power supply voltage generation circuit 150, a power supply voltage switch 160, a decoder 170 and a memory array 180. The decoder 170 includes an input terminal 171 and a plurality of output terminals 172-1~172-N. The memory array 180 includes a plurality of source lines 181 and a plurality of memory units 182. Specifically, the source lines 181 are electrically coupled to the output terminals 172-1~172-N of the decoder 170, respectively; and each one of the source lines 181 is electrically coupled to N number of memory units 182, wherein N is a natural number. In this embodiment, the decoder 170 is a source line decoder.

The power supply voltage switch 160, electrically coupled between an output terminal (not labeled) of the power supply voltage generation circuit 150 and the input terminal 171 of the decoder 170, is configured to receive a power supply voltage PV1 from the power supply voltage generation circuit 150 and a preset voltage PV2 and selectively output, according to a control command CM, either the power supply voltage PV1 or the preset voltage PV2 to the input terminal 171 of the decoder 170. In this embodiment, the power supply voltage generation circuit 150 can be realized by a low dropout regulator. In addition, the power supply voltage PV1 herein is used as a programming voltage, and the preset voltage PV2 herein is used as a readout voltage.

Each individual load 140 and each individual memory unit 182 are configured to have the same internal circuit structure, so that both have the same load value. In this embodiment, each of the loads 140 is realized by a redundant memory unit. Specifically, the memory units 182 and the redundant memory units in the memory 100 each includes a floating-gate transistor 141. In this embodiment, each one of the floating-gate transistors 141 in the redundant memory units is configured to have the first source/drain thereof electrically coupled to the input terminal 171 of the decoder 170 and the second source/drain electrically thereof electrically coupled to a reference voltage (e.g., the ground potential GND).

The load detection circuit 120 is configured to obtain N-bit input data of the memory 100, determine the number of the memory units 182 required to update the content stored therein when the memory 100 is performing a program operation based on the N-bit input data, and accordingly generate a first determination result DS1. The load control circuit 130, electrically coupled to the gate of each one of the floating-gate transistors 141 in the redundant memory units, is configured to determine the conducting state of the floating-gate transistors 141 in the redundant memory units according to the first determination result DS1. Specifically, if the first determination result DS1 indicates that there are M number of memory units 182 required to update the content stored therein, the load control circuit 130 turns on (N−M) number of floating-gate transistors 141 accordingly (or, provides (N−M) number of floating-gate transistors 141 to the decoder 180) so as to couple the (N−M) number of provided loads 140 to a transmission path of the power supply voltage PV1 in parallel; wherein M is a natural number, and the aforementioned transmission path will be described in detail later. It is to be noted that the number of loads 140 required to be coupled to the transmission path in parallel decreases with the increasing number of memory units 182 required to update the content stored therein; and the number of loads 140 required to be coupled to the transmission path in parallel increases with the decreasing number of memory units 182 required to update the content stored therein. In addition, it is to be noted that the sum of the number of memory units 182 required to update the content stored therein and the number of loads 140 required to be coupled to the transmission path in parallel is always N.

To obtain a better understanding of the present invention, the following is an example for illustrating an operation of the memory 100; wherein in this example, N is set to 8. Please refer to FIG. 1 again. First, the load detection circuit 120, after obtaining the 8-bit input data of the memory 100, determines the number of the memory units 182 required to update the content stored therein when the memory 100 is performing a program operation based on the 8-bit input data and generates the first determination result DS1 accordingly. Then, the load control circuit 130, if the first determination result DS1 indicates that there are six memory units 182 required to update the content stored therein, turns on two (that is, 8-6) floating-gate transistors 141 (or provides two floating-gate transistors 141 to the decoder 180) and thereby coupling the two provided loads 140 to a transmission path of the power supply voltage PV1 in parallel.

In addition, if the program operation performed by the memory 100 is associated with the memory units 182 electrically coupled to the output terminal 172-1 of the decoder 170, the decoder 170 accordingly, when the memory 100 is performing the program operation, electrically couples the input terminal 171 and the output terminal 172-1 thereof to each other so as to form an electrical path 173 therein. Thus, the electrical path formed between the power supply voltage switch 160 and the input terminal 171, the input terminal 171, the electrical path 173, the output terminal 172-1 and the source line 181 electrically coupled to the output terminal 172-1 corporately form a transmission path of the power supply voltage PV1; and consequently the two loads 140 provided by the load control circuit 130 are coupled in parallel to the transmission path when the memory 100 is performing the program operation.

Therefore, when the decoder 170 uses the received power supply voltage PV1 as a programming voltage to perform the program operation, the programming voltage can, through the aforementioned configuration of the memory 100, be maintained at a stable value due to the loads 140 are dynamically provided in response to the varying number of the memory units 182 to be driven.

Furthermore, to verify whether the result of the program operation is correct, the load detection circuit 120 is further configured to determine the number of different bits existing between the N-bit output data of the memory 100 and the aforementioned N-bit input data, and accordingly generate a second determination result DS2 and output the second determination result DS2 to the load detection circuit 120; wherein the N-bit output data is the data stored in the memory units 182 after being performed by the program operation according to the aforementioned N-bit input data. Correspondingly, the load control circuit 130 is further configured to determine whether or not to provide the load 140 to the decoder 170 according to the second determination result DS2. It is to be noted that the number of the loads 140 provided to the decoder 170 is not limited as long as the loads to be driven by the programming voltage is maintained at the load value of N number of memory units 182. In addition, the aforementioned verification operation can be performed repeatly until the N-bit input data and the N-bit output data are the same completely.

In addition, the load detection circuit 120 is further electrically coupled to the data input/output interface 110 and thereby being capable of receiving the N-bit input data and the N-bit output data from the data input/output interface 110. In addition, the data input/output interface 110 is further configured to latch the N-bit input data. In this embodiment, the data input/output interface 110 includes an input data transmission unit 112, configured to transmit and latch the N-bit input data, and an output data transmission unit 114, configured to transmit the N-bit output data.

Figure 2:
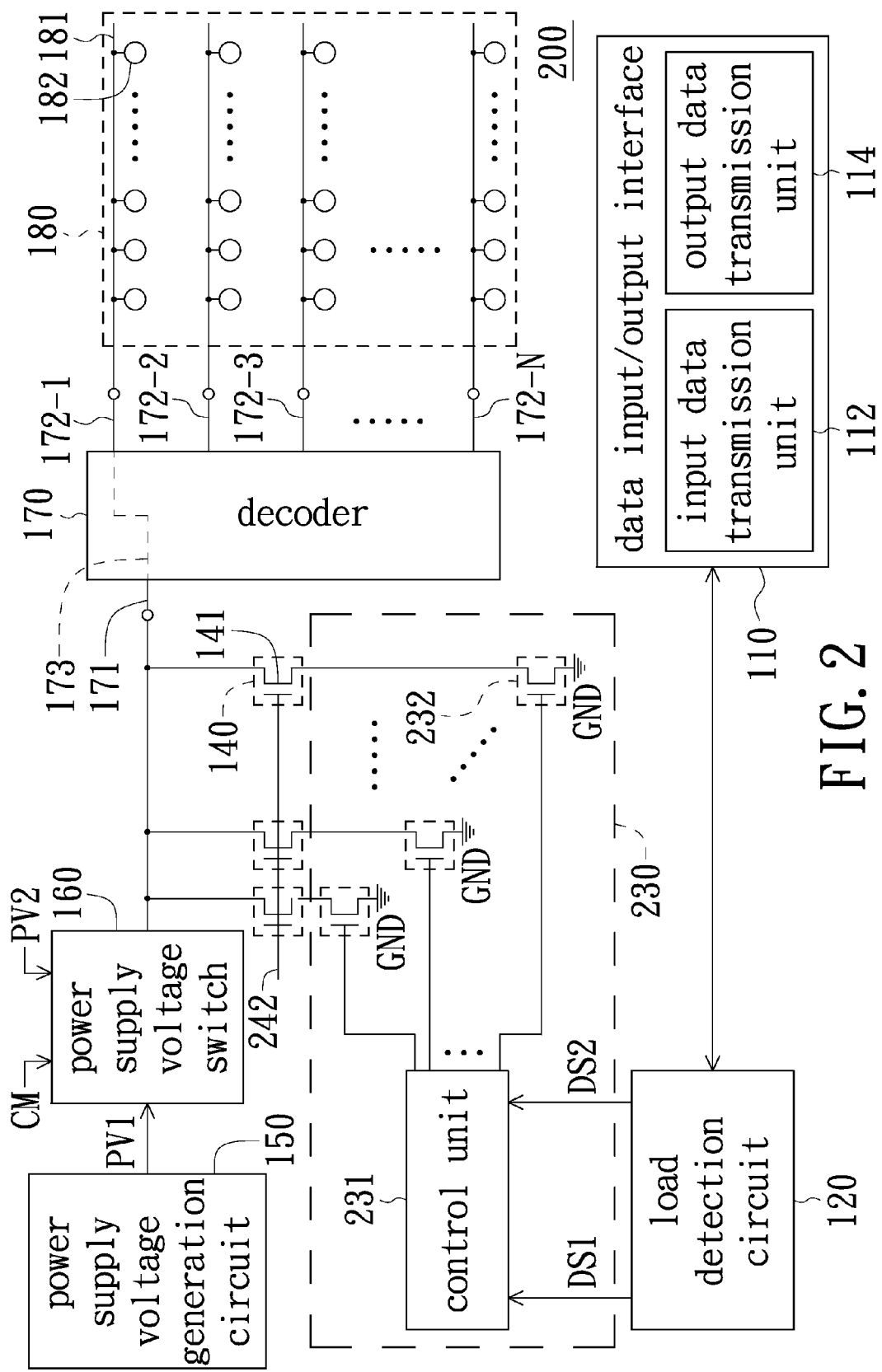
FIG. 2 is a schematic view of a memory in accordance with a second embodiment of the present invention.

FIG. 2 is a schematic view of a memory in accordance with a second embodiment of the present invention; wherein it is to be noted that only the portion of circuit structure associated with the present invention is depicted in FIG. 2, and the memory herein is exemplified by a flash memory. As shown, the main difference between the memory 200 in this embodiment and the memory 100 shown in FIG. 1 is the electrical-coupling configuration of the floating-gate transistors 141 in the redundant memory units. In addition, the memory 200 also employs a load control circuit 230 configured to control the floating-gate transistors 141 and includes an additional bit line 242.

As shown in FIG. 2, each one of the floating-gate transistors 141 in the redundant memory units is configured to have the gate thereof electrically coupled to the same bit line 242 and the first source/drain thereof electrically coupled to the input terminal 171 of the decoder 170. In addition, the load control circuit 230 includes a control unit 231 and a plurality of switches 232. Specifically, each one of the switches 232 is electrically coupled between the second source/drain of the floating-gate transistor 141 in the respective redundant memory unit and the ground potential GND. The control unit 231, electrically coupled to the control terminal of each one of the switches 232, is configured to determine whether or not to turn on at least one switch 232 according to either the first determination result DS1 or the second determination result DS2. In this embodiment, the switches 232 each are realized by a NMOS transistor; and the present invention is not limited thereto.

Figure 3:
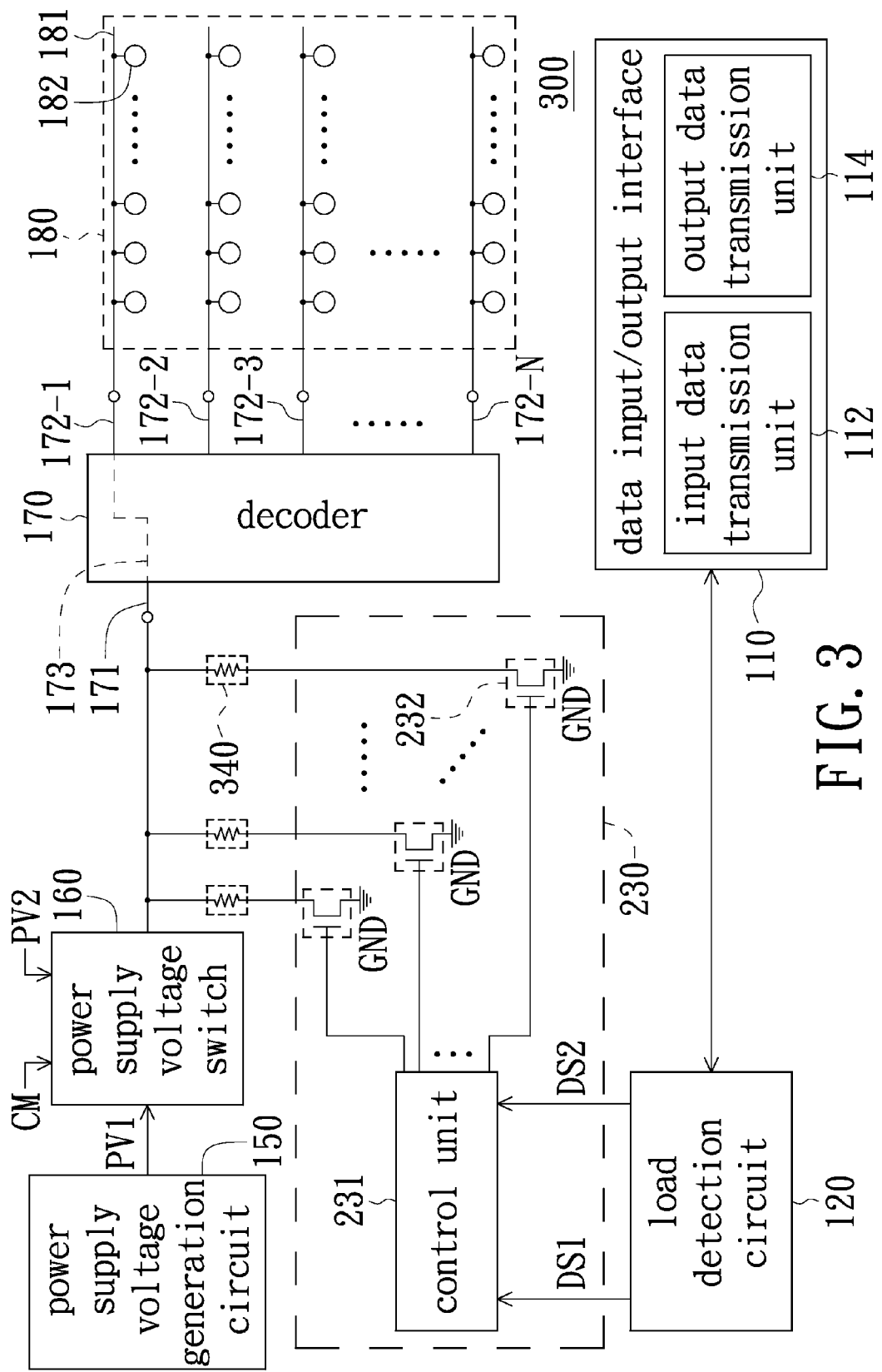
FIG. 3 is a schematic view of a memory in accordance with a third embodiment of the present invention.

FIG. 3 is a schematic view of a memory in accordance with a third embodiment of the present invention; wherein it is to be noted that only the portion of circuit structure associated with the present invention is depicted in FIG. 3, and the memory herein is exemplified by a flash memory. As shown, the main difference between the memory 300 in this embodiment and the memory 200 shown in FIG. 2 is that each of the loads 340 is realized by a resistor.

Figure 4:
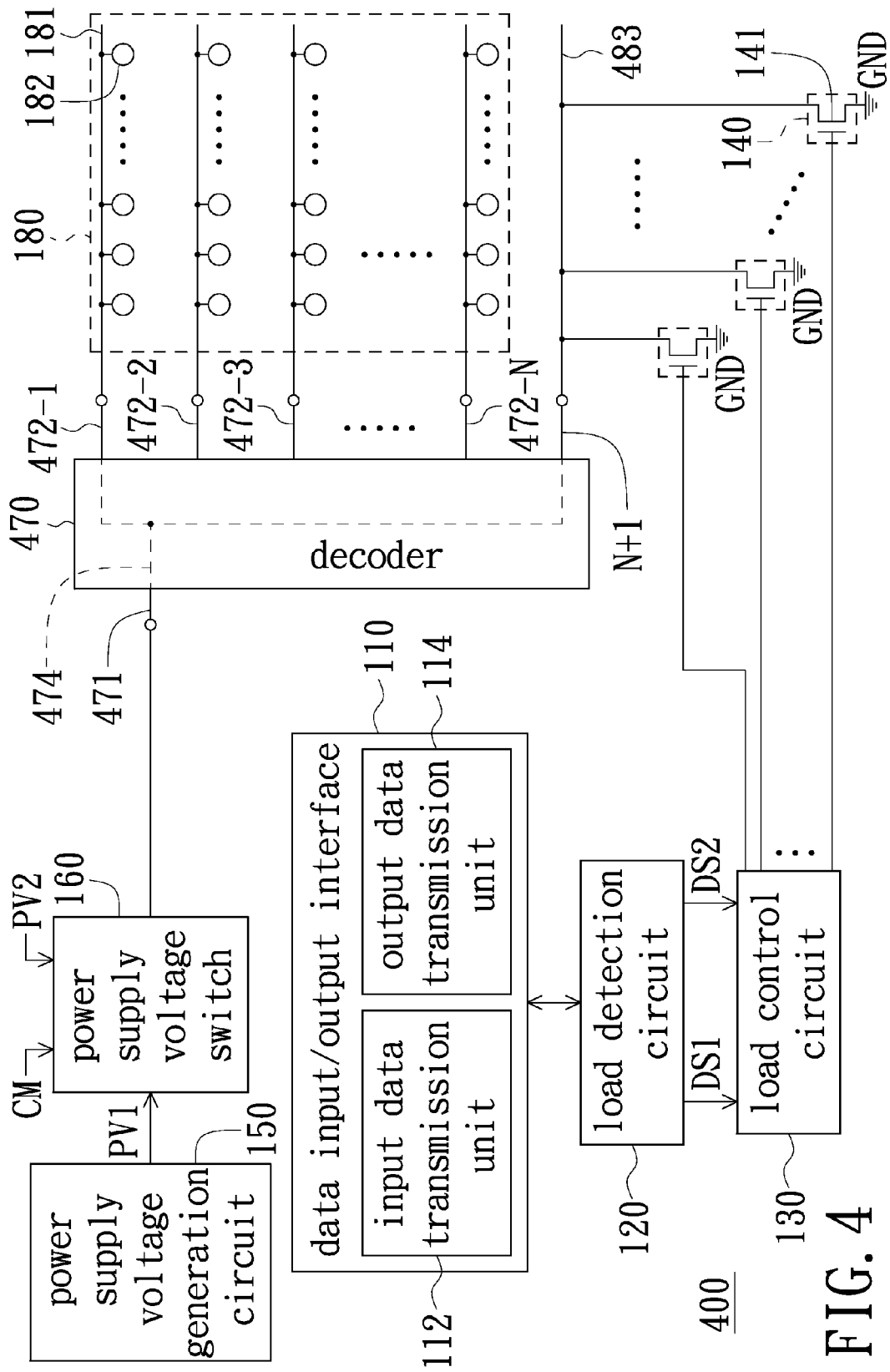
FIG. 4 is a schematic view of a memory in accordance with a fourth embodiment of the present invention.

FIG. 4 is a schematic view of a memory in accordance with the fourth embodiment of the present invention; wherein it is to be noted that only the portion of circuit structure associated with the present invention is depicted in FIG. 4, and the memory herein is exemplified by a flash memory. As shown, the main difference between the memory 400 in this embodiment and the memory 100 shown in FIG. 1 is the electrical-coupling configuration of the floating-gate transistors 141 in the redundant memory units. In addition, the memory 400 also employs a decoder 470 electrically coupled to the source lines 181 of the memory array 180 and includes an additional source line 483. The decoder 470 includes an input terminal 471 and a plurality of output terminals 472-1~472-N and N+1. Specifically, the decoder 470 is configured to, when the memory 400 is performing the program operation, have the output terminals N+1 thereof and another specific one of the output terminals 472-1~472-N, associated with the memory unit(s) 182 required to be performed by the program operation, electrically coupled to each other.

For example, as illustrated in FIG. 4, the decoder 470 is, when the memory 400 is performing the program operation, configured to electrically couple the input terminal 471 and the output terminals 472-1, N+1 thereof to each other and thereby corporately forming an electrical path 474 therein. Consequently, the electrical path formed between the power supply voltage switch 160 and the input terminal 471, the input terminal 471, the electrical path 474, the output terminal 472-1, the source line 181 electrically coupled to the output terminal 472-1, the output terminal N+1 and the source line 483 corporately form a transmission path of the power supply voltage PV1. Therefore, the loads 140 provided by the load control circuit 130 are coupled in parallel to the transmission path when the memory 400 is performing the program operation.

Figure 5:
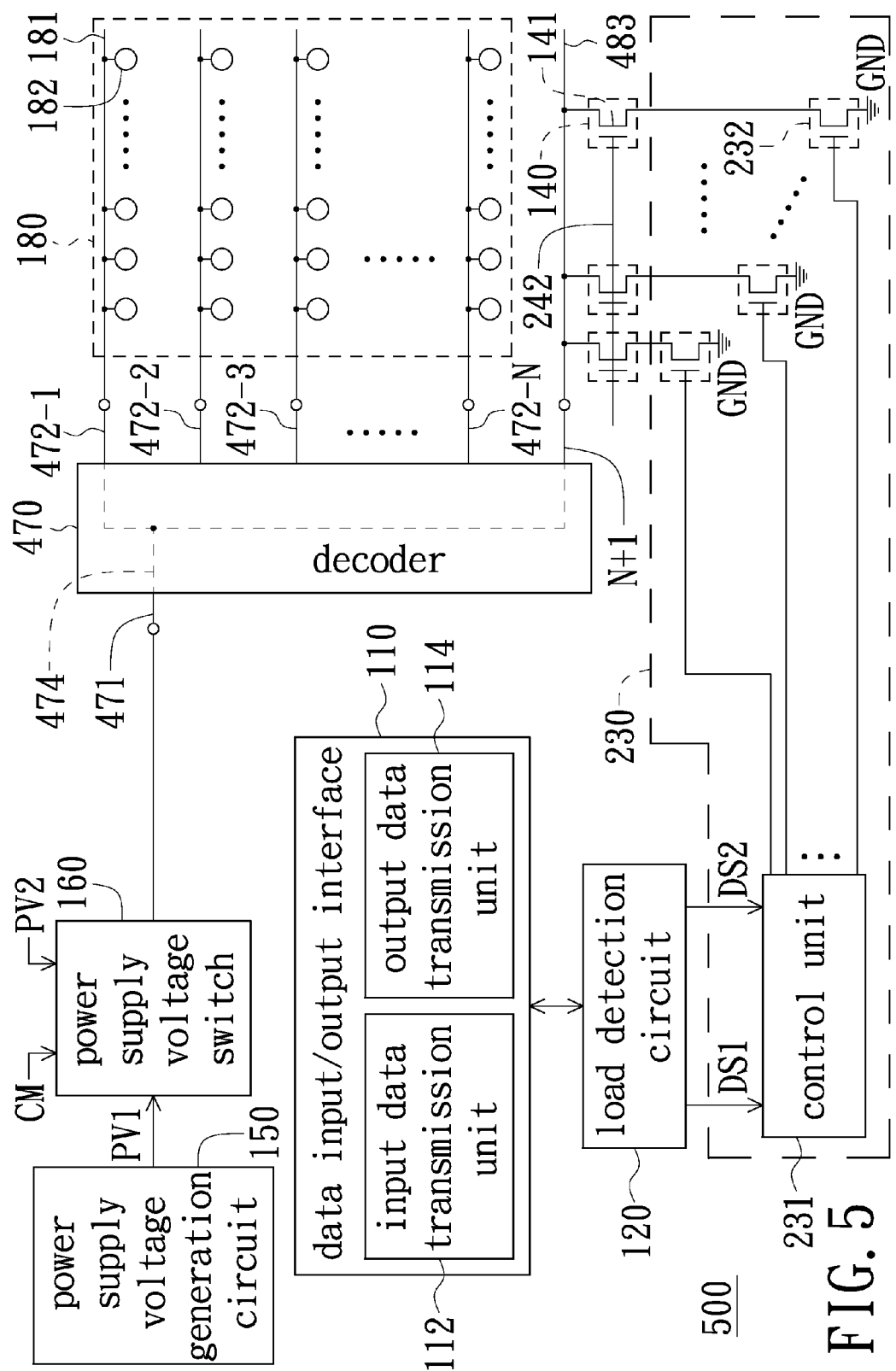
FIG. 5 is a schematic view of a memory in accordance with a fifth embodiment of the present invention

FIG. 5 is a schematic view of a memory in accordance with a fifth embodiment of the present invention; wherein it is to be noted that only the portion of circuit structure associated with the present invention is depicted in FIG. 5, and the memory herein is exemplified by a flash memory. As shown, the main difference between the memory 500 in this embodiment and the memory 400 shown in FIG. 4 is the electrical-coupling configuration of the floating-gate transistors 141 in the redundant memory units. In addition, the memory 500 also employs the load control circuit 230 configured to control the floating-gate transistors 141, and includes an additional bit line 242.

As shown in FIG. 5, each one of the floating-gate transistors 141 in the redundant memory units is configured to have the gate thereof electrically coupled to the same bit line 242 and the first source/drain thereof electrically coupled to the output terminal N+1 of the decoder 470. In addition, each one of the switches 232 in the load control circuit 230 is electrically coupled between the second source/drain of the floating-gate transistor 141 in the respective redundant memory unit and the ground potential GND.

Figure 6:
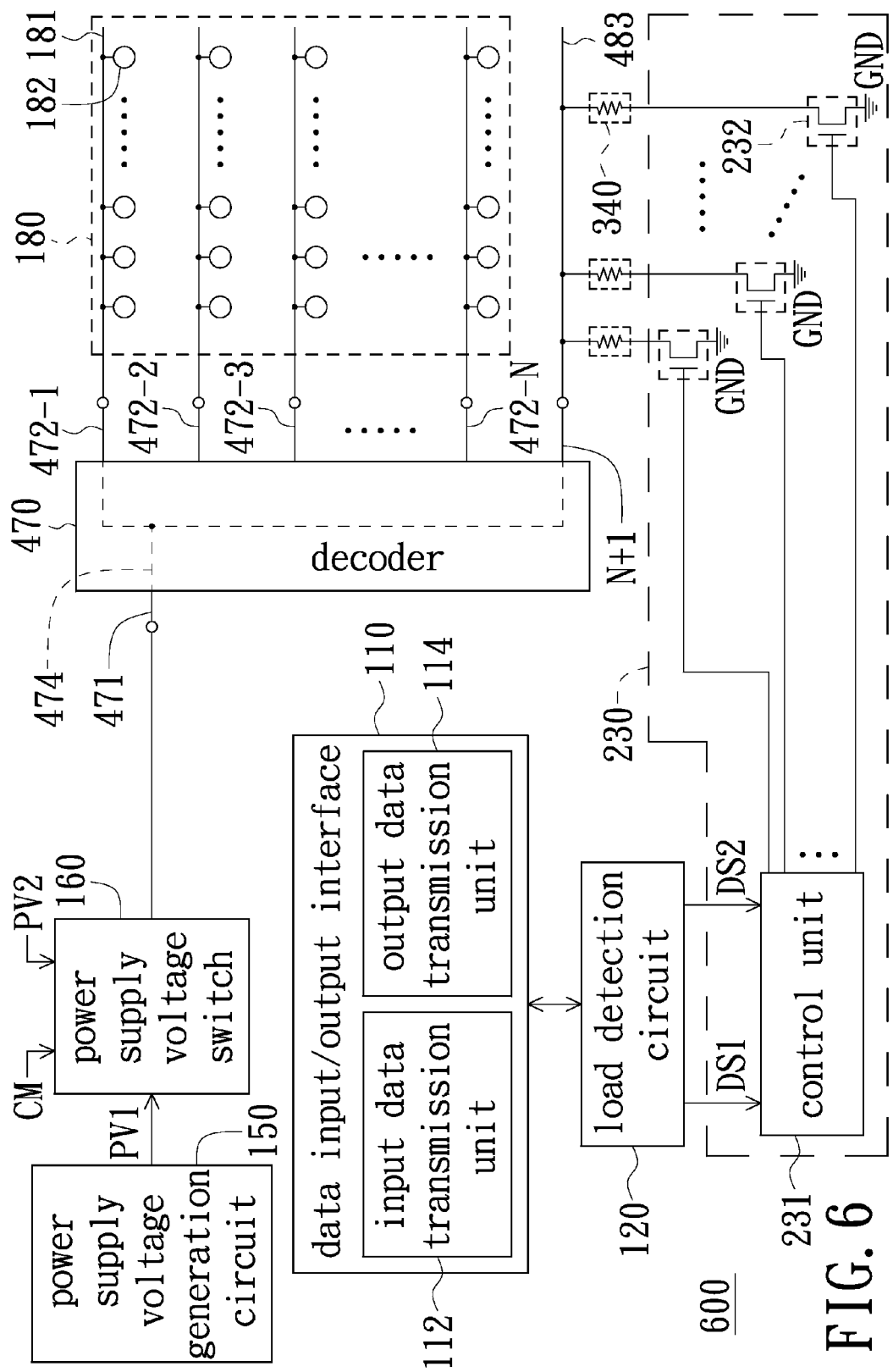
FIG. 6 is a schematic view of a memory in accordance with a sixth embodiment of the present invention.

FIG. 6 is a schematic view of a memory in accordance with a sixth embodiment of the present invention; wherein it is to be noted that only the portion of circuit structure associated with the present invention is depicted in FIG. 6, and the memory herein is exemplified by a flash memory. As shown, the main difference between the memory 600 in this embodiment and the memory 500 shown in FIG. 5 is that each one of the loads 340 is realized by a resistor.

Each of the aforementioned embodiments is exemplified by the internal circuit structure of a flash memory; however, the present invention is not limited thereto. In other words, it is understood that the each one of the embodiments of the present invention can further apply to other types of memory.

Figure 7:
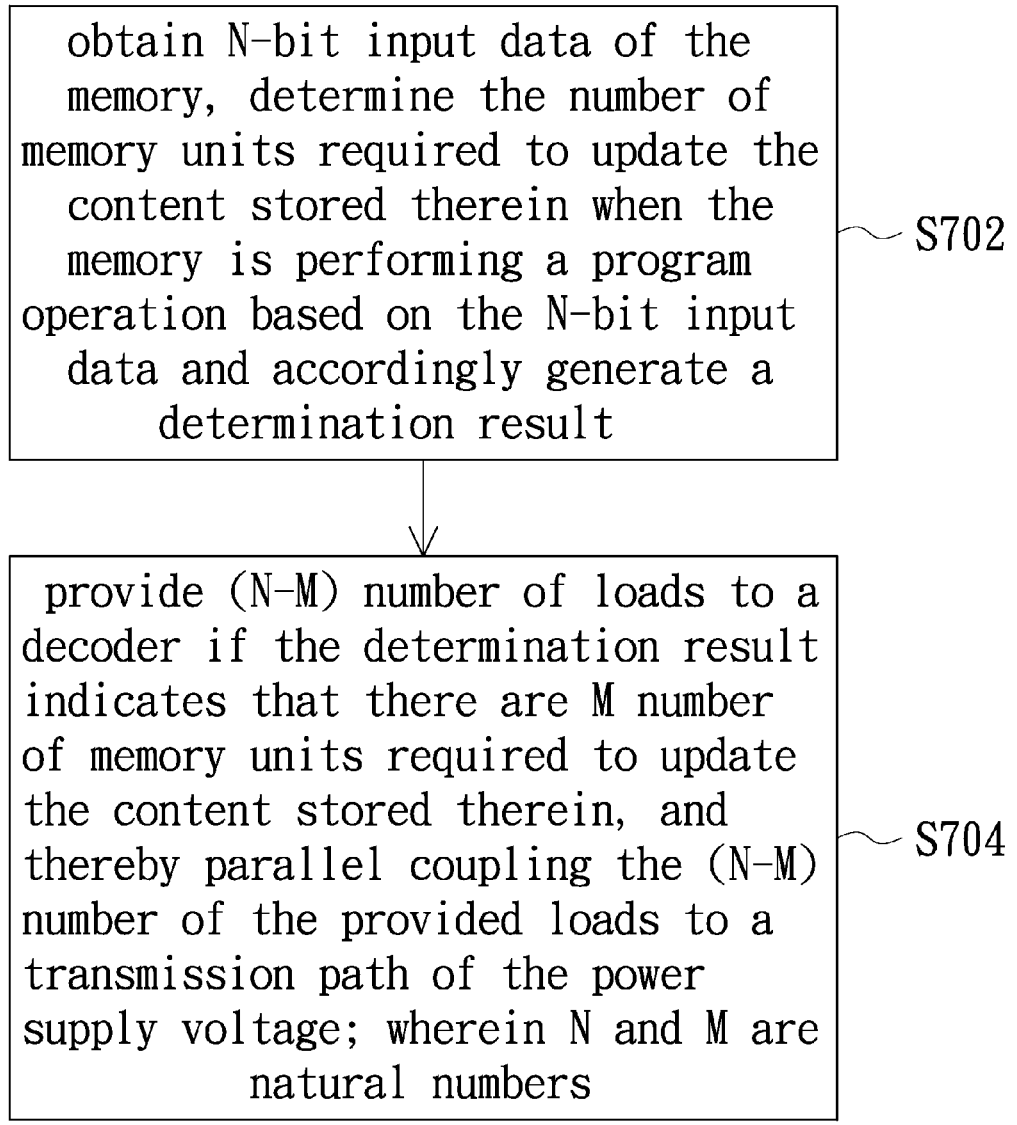
FIG. 7 is a schematic flow chart illustrating an operation method of a memory in accordance with an embodiment of the present invention.

Thus, an operation method of a memory can be summarized from the descriptions of the aforementioned embodiments by those ordinarily skilled in the art. The memory includes a decoder and a memory array. The decoder includes an input terminal and a plurality of output terminals; wherein the input terminal is configured to receive a power supply voltage. The memory array includes a plurality of source lines and a plurality of memory units. Specifically, the source lines are electrically coupled to the output terminals of the decoder, respectively; and each one of the source lines is electrically coupled to N number of memory units. FIG. 7 is a schematic flow chart illustrating an operation method of a memory as illustrated in the aforementioned embodiments. As shown, the operation method includes the following steps: obtaining N-bit input data of the memory, determining the number of memory units required to update the content stored therein when the memory is performing a program operation based on the N-bit input data and accordingly generating a determination result (step S702); providing (N−M) number of loads to the decoder if the determination result indicates that there are M number of memory units required to update the content stored therein, and thereby coupling the (N−M) number of provided loads in parallel to a transmission path of the power supply voltage, wherein N and M both are natural numbers (step S704).

In summary, the memory of the present invention further employs a plurality of loads, a load detection circuit and a load control circuit; wherein the loads each are configured to have a load value equal to that of each one of the memory unit. In addition, the load detection circuit is further configured to obtain N-bit input data of the memory, determine the number of memory units required to update the content stored therein when the memory is performing a program operation based on the N-bit input data and thereby generating a first determination result DS1 accordingly. If the first determination result indicates that there is M number of memory units required to update the content stored therein, the load control circuit provides (N−M) number of loads to the decoder electrically coupled to the source lines and thereby coupling the (N−M) number of provided loads to a transmission path of the power supply voltage in parallel. Thus, the programming voltage can, through the aforementioned configuration of the memory of the present invention, be maintained at a stable value due to the loads are dynamically provided in response to the number of the memory unit required to be driven.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory, comprising:
    a decoder comprising an input terminal and a plurality of output terminals, the input terminal being configured to receive a power supply voltage;
        a memory array comprising a plurality of source lines and a plurality of memory units, the source lines each being electrically coupled to the respective output terminal of the decoder and N number of memory units;
        a plurality of loads each having a load value equal to that of each one of the memory units;
        a load detection circuit configured to obtain a N-bit input data of the memory, determine the number of the memory units required to update the content stored therein when the memory is performing a program operation based on the N-bit input data, and generate a first determination result accordingly; and
        a load control circuit configured to receive the first determination result, wherein if the first determination result indicates that there are M number of the memory units required to update the content stored therein, the load control circuit provides (N−M) number of the loads to the decoder so as to couple in parallel the (N−M) number of the provided loads to a transmission path of the power supply voltage, wherein N and M are natural numbers.

2. The memory according to claim 1, wherein the load detection circuit is further configured to determine the number of different bits existing between a N-bit output data and the N-bit input data, accordingly generate a second determination result and output the second determination result to the load detection circuit, the load control circuit is further configured to determine whether or not to provide load to the decoder according to the second determination result, wherein the N-bit output data is the data stored in the memory units after being processed by the program operation according to the N-bit input data.

3. The memory according to claim 2, further comprising:
    a data input/output interface, through which the load detection circuit obtaining the N-bit output data and the N-bit input data.

4. The memory cell according to claim 1, wherein each of the loads is realized by a redundant memory unit, each of the memory units and the redundant memory units comprises a floating-gate transistor, each one of the floating-gate transistors in the redundant memory units is configured to have the gate thereof electrically coupled to one same bit line and the first source/drain thereof electrically coupled to the input terminal of the decoder.

5. The memory according to claim 1, wherein the load control circuit comprises a control unit and a plurality of switches, each one of the switches is electrically coupled between the second source/drain of the floating-gate transistor in the respective redundant memory unit and a reference voltage, the control unit, electrically coupled to the control terminal of the each one of the switches, is configured to determine whether or not to turn on at least one of the switches according to the first determination result.

6. The memory according to claim 1, wherein each of the loads is realized by a redundant memory unit, each of the memory units and the redundant memory units comprises a floating-gate transistor, each one of the floating-gate transistors in the redundant memory units is configured to have the first source/drain thereof electrically coupled to the input terminal of the decoder and the second source/drain thereof electrically coupled to a reference voltage.

7. The memory according to claim 6, wherein the load control circuit is electrically coupled to the gate of each one of the floating-gate transistors in the redundant memory units and configured to determine whether or not to turn on at least one of the floating-gate transistors according to the first determination result.

8. The memory according to claim 1, wherein each of the loads comprises a resistor configured to have the first terminal thereof electrically coupled to the input terminal of the decoder.

9. The memory according to claim 8, wherein the load control circuit comprises a control unit and a plurality of switches, each of the switches is electrically coupled between the second terminal of the respective resistor and a reference voltage, the control unit, electrically coupled to the control terminal of each one of the switches, is configured to determine whether or not to turn on at least one of the switches according to the first determination result.

10. The memory according to claim 1, wherein the decoder is further configured to electrically couple a first output terminal and a second output terminal thereof to each other when the memory is performing the program operation, wherein the first output terminal is electrically coupled to the memory units required to be performed by the program operation via one of the source lines.

11. The memory according to claim 10, wherein each of the loads is realized by a redundant memory unit, each of the memory units and the redundant memory units comprises a floating-gate transistor, each one of the floating-gate transistors in the redundant memory units is configured to have the gate thereof electrically coupled to one same bit line and the first source/drain thereof electrically coupled to the second output terminal of the decoder.

12. The memory according to claim 11, wherein the load control circuit comprises a control unit and a plurality of switches, each of the switches is electrically coupled between the second source/drain of the floating-gate transistor in the respective redundant memory unit and a reference voltage, the control unit, electrically coupled to the control terminal of each one of the switches, is configured to determine whether or not to turn on at least one of the switches according to the first determination result.

13. The memory according to claim 10, wherein each one of the loads is realized by a redundant memory unit, the memory units and the redundant memory units each comprise a floating-gate transistor, each one of the floating-gate transistors in the redundant memory units is configured to have the first source/drain thereof electrically coupled to the second output terminal of the decoder and the second source/drain thereof electrically coupled to a reference voltage, the load control circuit is electrically coupled to the gate of each one of the floating-gate transistors in the redundant memory units and configured to determine whether or not to turn on at least one of the floating-gate transistors according to the first determination result.

14. The memory according to claim 10, wherein each of the loads comprises a resistor configured to have the first terminal thereof electrically coupled to the second output terminal of the decoder.

15. The memory according to claim 14, wherein the load control circuit comprises a control unit and a plurality of switches, each one of the switches is electrically coupled between the second terminal of the respective resistor and a reference voltage, the control unit, electrically coupled to the control terminal of each one of the switches, is configured to determine whether or not to turn on at least one of the switches according to the first determination result.

16. An operation method of a memory, the memory comprising a decoder and a memory array, the decoder comprising an input terminal and a plurality of output terminals, the input terminal being configured to receive a power supply voltage, the memory array comprising a plurality of source lines and a plurality of memory units, the source lines each being electrically coupled to the respective output terminal of the decoder and N number of memory units, the operation method comprising:
obtaining a N-bit input data of the memory, determining the number of memory units required to update the content stored therein when the memory is performing a program operation based on the N-bit input data and accordingly generate a first determination result; and
providing (N−M) number of loads to the decoder if the first determination result indicates that there are M number of memory units required to update the content stored therein, and thereby coupling the (N−M) number of the provided loads in parallel to a transmission path of the power supply voltage, wherein N and M are natural numbers.

17. The operation method according to claim 16, each one of the loads has a load value equal to that of each one of the memory units.

18. The operation method according to claim 16, further comprising:
a. determining the number of different bits existing between a N-bit output data and the N-bit input data and accordingly generating a second determination result, wherein the N-bit output data is the data stored in the memory units after being processed by the program operation according to the N-bit input data; and
b. determining whether or not to provide load to the decoder according to the second determination result.

19. The operation method according to claim 18, wherein the steps a, b are performed repeatedly until the N-bit output data of the memory is consistent with the N-bit input data.

20. The operation method according to claim 16, further comprising:
obtaining the N-bit output data and the N-bit input data through a data input/output interface of the memory.

* * * * *